United States Patent [19]

Ma

[11] Patent Number: 5,691,882
[45] Date of Patent: Nov. 25, 1997

[54] PCMCIA MOUNTING STRUCTURE

[76] Inventor: Hsi-Kuang Ma, 4F, No. 48, Sec. 2, Chung Cherng Rd., Taipei, Taiwan

[21] Appl. No.: 658,213

[22] Filed: Jun. 4, 1996

[51] Int. Cl.⁶ .............................. G06F 1/16; H05K 7/10
[52] U.S. Cl. ............................. 361/684; 361/686; 439/77
[58] Field of Search ........................... 361/680–686, 361/724–727, 737, 752; 364/708.1; 439/76.1, 77; G06F 1/16

[56] References Cited

U.S. PATENT DOCUMENTS 5,475,441  12/1995  Parulski et al. ............... 348/552
5,521,369  5/1996  Kumar ............................ 235/472
5,540,597  7/1996  Budman et al. ................ 439/77

*Primary Examiner*—Leo P. Picard
*Assistant Examiner*—Lynn D. Feild
*Attorney, Agent, or Firm*—Bacon & Thomas

[57] ABSTRACT

A PCMCIA mounting structure including a peripheral apparatus, a PCMCIA, and a cable connected between the peripheral apparatus and the PCMCIA, wherein the peripheral apparatus has a recess at for example the bottom side thereof adapted for receiving the PCMCIA and the cable.

7 Claims, 3 Drawing Sheets

PCMCIA MOUNTING STRUCTURE

BACKGROUND OF THE INVENTION

The present invention relates to a PCMCIA mounting structure which includes a PCMCIA connected to a peripheral apparatus by a cable that can be received in a recess at the bottom side of the peripheral apparatus when not in use.

Notebook computers have become more and more popular nowadays for the advantage of high mobility. However, a notebook computer has its limitation in function. In order to add additional functions to a notebook, peripheral apparatus shall be attached. Therefore, regular notebook computers commonly equipped with a PCMCIA jack for the connection of a peripheral apparatus by a PCMCIA. As illustrated in FIG. 1, a cable (20) is connected to a peripheral apparatus (30) for the connection of a PCMCIA (10) so that the peripheral apparatus (30) can be connected to the PCMCIA jack of a notebook computer by the PCMCIA (10). This arrangement is just to complete a masterpiece with poor writing. Because the PCMCIA (10) and the cable (20) are separately prepared, it is not convenient to carry the PCMCIA (10) and the cable (20) with the peripheral apparatus.

SUMMARY OF THE INVENTION

The present invention has been accomplished under the circumstances. According to the present invention, a PCMCIA is connected to a peripheral apparatus by a flat cable, which peripheral apparatus has a recess at for example a bottom side thereof adapted for receiving the flat cable and the PCMCIA. Therefore, when the peripheral apparatus is not in use, the flat cable and the PCMCIA are arranged within the recess.

DETAILED DESCRIPTION OF THE PREFERRED EMBODIMENT

Figure 1:
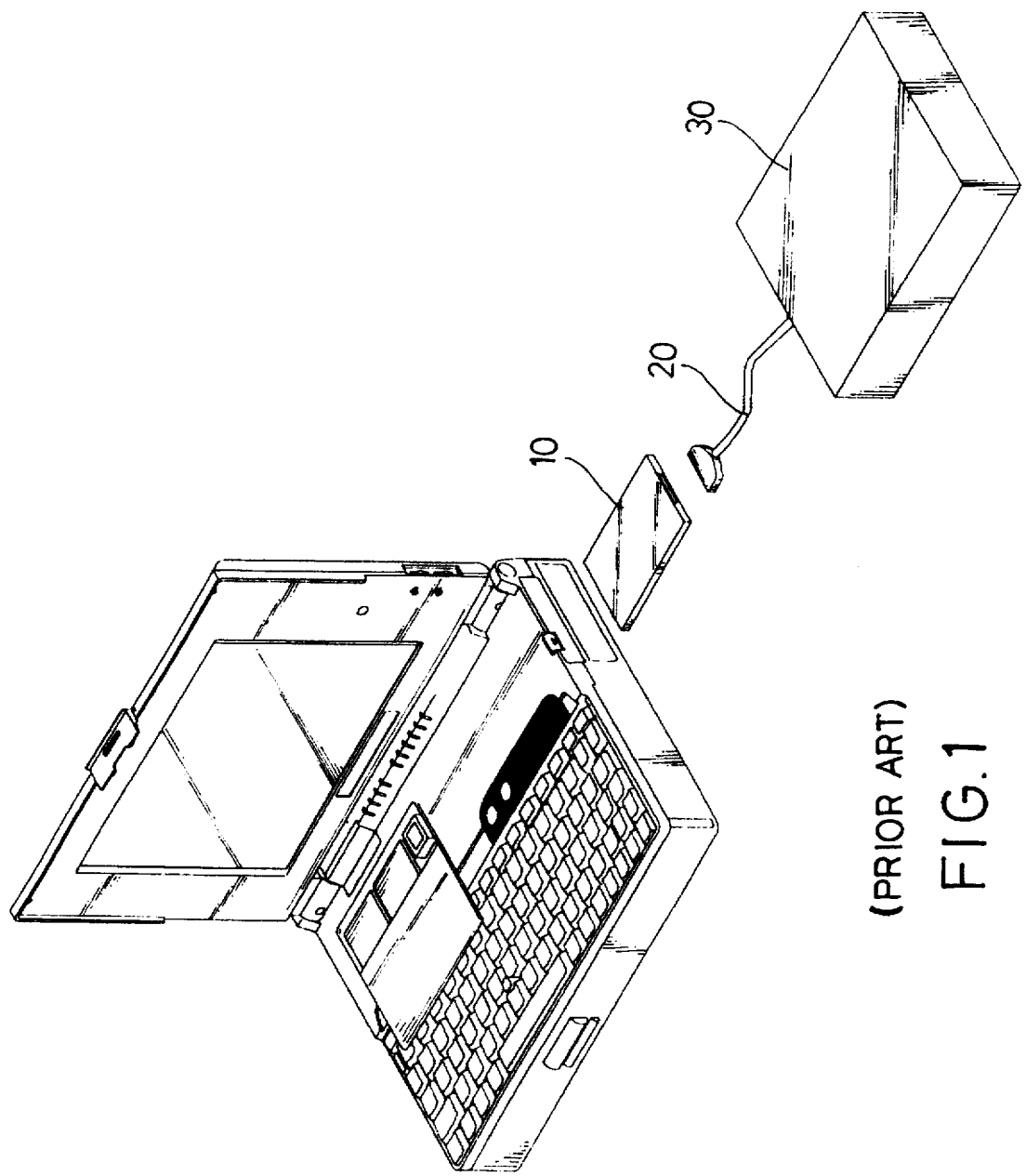
FIG. 1 is a schematic drawing showing the connection of a PCMCIA between a notebook computer and a peripheral apparatus according to the prior art.
Figure 2:
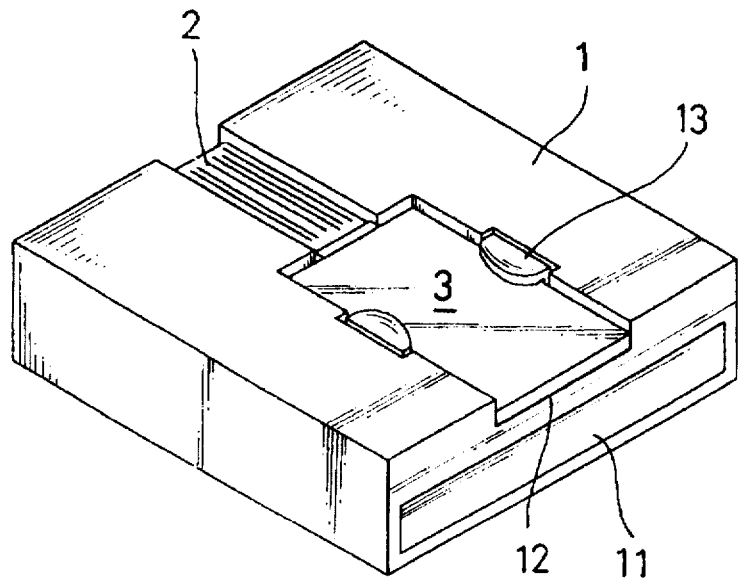
FIG. 2 is a back elevational view of the present invention, showing the PCMCIA and the lead cable received in the recess of the peripheral apparatus.
Figure 3:
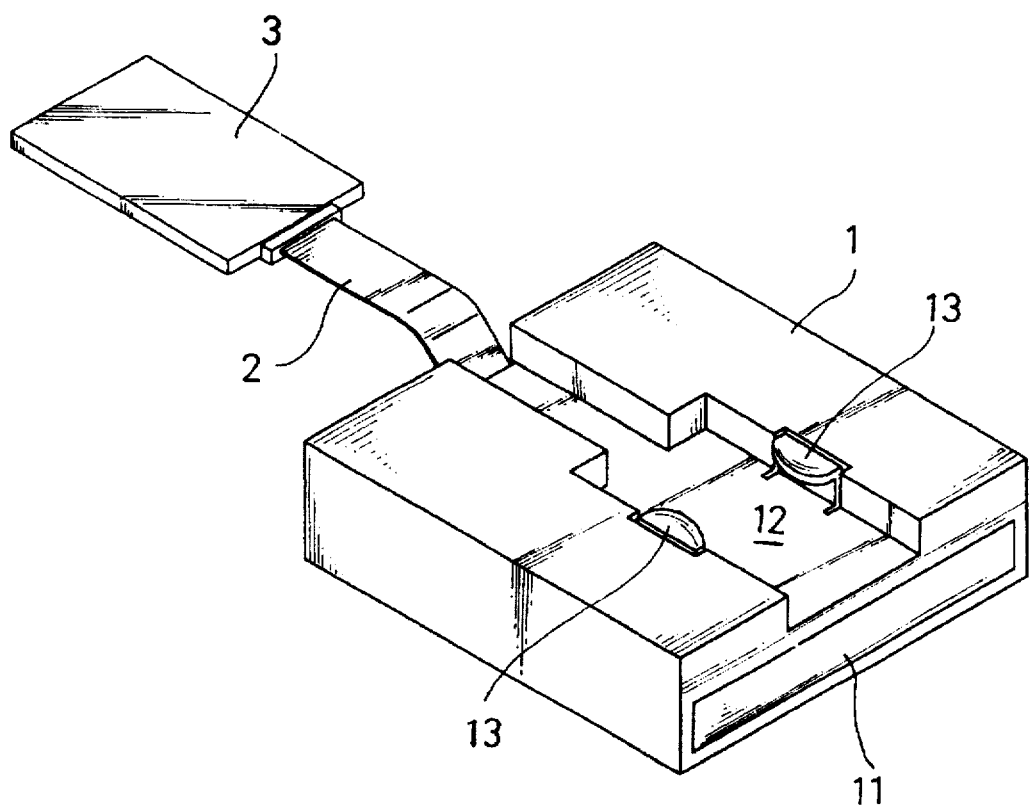
FIG. 3 is similar to FIG. 2 but showing the PCMCIA removed from the recess of the peripheral apparatus.

Referring to FIGS. 2 and 3, a PCMCIA mounting structure in accordance with the present invention is generally comprised of a peripheral apparatus 1, a lead cable 2, and a PCMCIA 3. The peripheral apparatus 1 can be a hard diskdrive, floppy diskdrive, CD-ROM, etc., having a slot 11 at the front side for the loading of a disk (the slot 11 is omitted if the peripheral apparatus 1 is a hard diskdrive), a recess 12 at one side adapted for receiving the PCMCIA 3 and the lead cable 2, and two retainers for example half-round clamping plates 13 bilaterally disposed in the recess 12 and adapted for securing the PCMCIA 3 in the recess 12. The lead cable 2 is a flat cable having one end connected to the peripheral apparatus 1 and an opposite end connected to the PCMCIA 3. The PCMCIA 3 has a flat profile adapted for mounting in a slot in a notebook computer to become electrically connected to the notebook computer. FIG. 3 shows the PCMCIA 3 removed from the recess 12 of the peripheral apparatus 1. FIG. 2 shows the PCMCIA 3 received in the recess 12 of the peripheral apparatus 1, and secured in place by the retainers 13.

Figure 4:
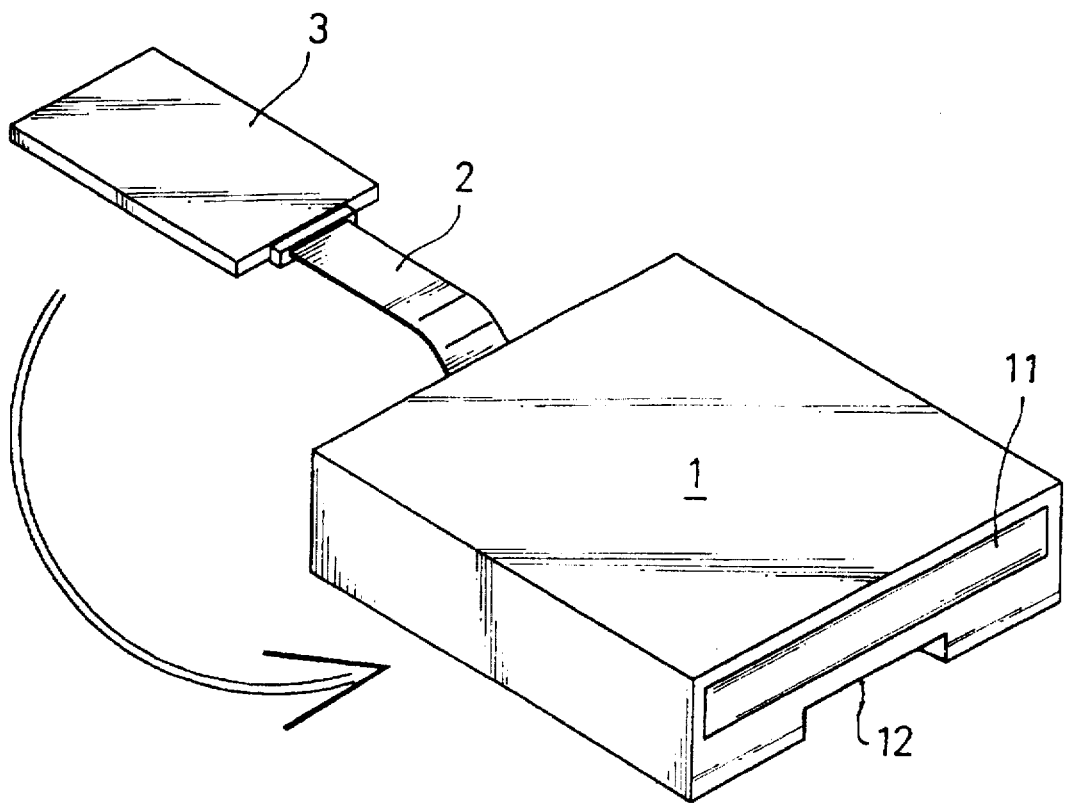
FIG. 4 is a front elevational view of the present invention, showing the PCMCIA removed from the recess of the peripheral apparatus.
Figure 5:
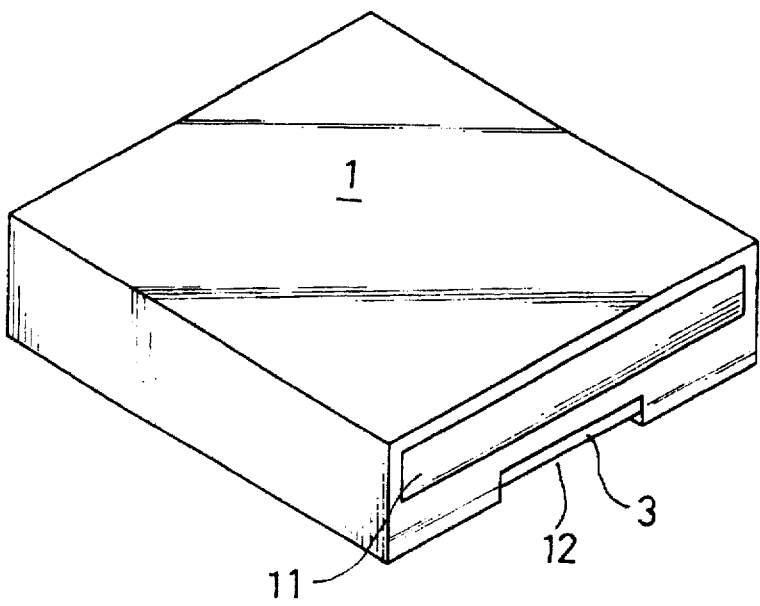
FIG. 5 is another front elevational view of the present invention, showing the PCMCIA received in the recess of the peripheral apparatus.

Referring to FIGS. 4 and 5, the recess 12 is formed in the bottom side of the peripheral apparatus 1. When the PCMCIA 3 and the lead cable 2 are received in the recess 12, the PCMCIA 3 does not project out of the border of the peripheral apparatus 1.

While only one embodiment of the present invention has been shown and described, it will be understood that various modifications and changes could be made without departing from the spirit and scope of the invention.

What the invention claimed is:

1. A peripheral device for attachment to a computer having a memory card slot comprising:

a) a memory card configured to be inserted into the memory card slot;

b) a lead cable connected to the memory card and to the peripheral device;

c) a housing enclosing the peripheral device and having a recess configured to store the lead cable and the memory card therein; and, d) retainer means located on the housing to retain the memory card in the recess.

2. The peripheral device of claim 1 wherein said housing has an outer peripheral border wherein said recess is located such that said memory card does not protrude beyond the border when retained in the recess.

3. The peripheral device of claim 1 wherein said housing has a bottom side and wherein said recess is formed in said bottom side thereof.

4. The peripheral device of claim 1 comprising a floppy disk drive, wherein said housing has a front side with a disk slot in said front side thereof.

5. The peripheral device of claim 1 wherein said housing has a front side with a CD slot in said front side thereof.

6. The peripheral device of claim 1 wherein the retainer means comprises a plurality of clamping plates on said housing.

7. The peripheral device of claim 6 wherein the clamping plates are substantially semi-circular in configuration.

* * * * *